United States Patent [19]

Anantha et al.

[11] Patent Number: 4,583,106
[45] Date of Patent: Apr. 15, 1986

[54] FABRICATION METHODS FOR HIGH PERFORMANCE LATERAL BIPOLAR TRANSISTORS

[75] Inventors: Narasipur G. Anantha, Hopewell Junction; Jacob Riseman; Paul J. Tsang, both of Poughkeepsie, all of N.Y.

[73] Assignee: International Business Machines Corporation, Armonk, N.Y.

[21] Appl. No.: 754,698

[22] Filed: Jul. 15, 1985

Related U.S. Application Data

[62] Division of Ser. No. 520,365, Aug. 4, 1983, Pat. No. 4,546,356.

[51] Int. Cl.$^4$ ............................................. H01L 29/72
[52] U.S. Cl. ........................................ 357/35; 357/44; 357/59
[58] Field of Search ......................... 357/35, 44, 59, 40

[56] References Cited

U.S. PATENT DOCUMENTS

| | | | |
|---|---|---|---|
| 4,283,236 | 8/1981 | Sirsi | 357/35 X |
| 4,357,622 | 11/1982 | Magdo | 357/44 |
| 4,512,075 | 4/1985 | Vora | 357/35 X |

OTHER PUBLICATIONS

Antipov, I.B.M. Tech. Discl. Bull. vol. 24, No. 3, Aug. 1981.
Cowan, I.B.M. Tech. Discl. Bull. vol. 13, No. 4, Sep. 1970.
Anantha, I.B.M. Tech. Discl. Bull. vol. 21, No. 7, Dec. 1978.

Primary Examiner—Martin H. Edlow
Attorney, Agent, or Firm—George O. Saile

[57] ABSTRACT

The lateral transistor is described which has both its base width and the emitter region of the transistor minimized. This minimization of the elements of the lateral transistor gives high performance. The lateral transistor which may be typically PNP transistor is formed in a monocrystalline semiconductor body having a buried N+ region within the body. A P type emitter region is located in the body. An N type base region is located around the side periphery of the emitter region. A P type collector region is located in the body surrounding the periphery of the base region. A first P+ polycrystalline silicon layer acting as an emitter contact for the emitter region is in physical and electrical contact with the emitter region and acts as its electrical contact. A second P+ polycrystalline silicon layer is located on the surface of the body to make physical and electrical contact with the collector region. A vertical insulator layer on the edge of the second polycrystalline silicon layer isolates the two polycrystalline silicon layers from one another. The N base region at its surface is located underneath the width of the vertical insulator layer. An N+ reach-through region extending from the surface of the body to the buried N+ region acts as an electrical contact through the N+ region layer to the base region. The width of the vertical insulator has a width which is equal to the desired base width of the lateral PNP transistor plus lateral diffusions of the collector and emitter junctions of the lateral PNP. The preferred structure is to have the emitter formed around the periphery of a channel or groove which has at its base an insulating layer such as silicon dioxide. The parasitic transistor is almost totally eliminated by this buried oxide isolation.

14 Claims, 14 Drawing Figures

FABRICATION METHODS FOR HIGH PERFORMANCE LATERAL BIPOLAR TRANSISTORS

This application is a division of application Ser. No. 520,365 filed 8/4/83, now U.S. Pat. No. 4,546,356.

DESCRIPTION

1. Technical Field

This invention relates to the fabrication and resulting lateral bipolar transistors and, more particularly to the fabrication and the resulting lateral transistor with or without a vertical bipolar transistor combination therewith.

2. Cross-Reference To Related Application

U.S. patent application Ser. No. 520,366, filed 8/04/83, entitled "Methods For Making High Performance Lateral Bipolar Transistors", by N. G. Anantha, T. H. Ning and P. J. Tsang (FI 9-82-068).

3. Background Art

Complementary bipolar integrated circuits having for example, PNP transistors and NPN transistors are potentially desirable in digital logic applications. However, the manufacture of complementary bipolar structures in integrated circuits have been somewhat difficult and the approaches to overcome the manufacturing problems have been to fabricate a combination of vertical NPN transistor and lateral PNP transistor simultaneously. Example of this type of complementary device and fabrication may be seen in the B. Agusta, et al., U.S. Pat. No. 3,524,113 in wherein one embodiment the lateral PNP and vertical NPN devices are formed within the same monocrystalline silicon pocket and have a common vertical NPN collector and lateral PNP base. Another example of this type of complementary structure may be seen in J. L. Dunkley, U.S. Pat. No. 3,971,059 where in the lateral structure, the N type epitaxial layer comprises the base with the emitter and collector regions both located within the base and spaced apart from each other. Both emitter and collector regions of the lateral PNP transistor are formed during the diffusion steps used to form the base region of the double-diffused vertical NPN transistor. Therefore, there are no high temperature processing steps after the formation of the NPN transistor. A still further example is shown in the N. G. Anantha, et al., U.S. Pat. No. 4,196,440 wherein the lateral PNP and vertical NPN devices are located in monocrystalline silicon pockets, wherein the silicon dioxide isolation surrounds the pocket and partially, below the surface, within the isolated monocrystalline region.

Independent lateral PNP devices have also been described in the art. For example, W. C. Schneider U.S. Pat. No. 3,615,939 illustrates such a lateral transistor device wherein the device is partially formed within the side periphery of a channel. A diffused collector region and base region surrounds this emitter peripheral area. The N. G. Anantha, et al., IBM Technical Disclosure Bulletin Vol. 21, No. 7, December 1978, Page 2753 and 2754 describes a lateral PNP device wherein the emitter and base regions are formed by an outdiffusion from a polycrystalline silicon pattern. This polycrystalline silicon pattern is then utilized as the ohmic contact to the resulting diffused regions.

While these devices described in the above paragraphs had been used in the past there are basic deficiencies in all such fabrication processes and the resulting lateral PNP devices and their combination in complementary integrated circuits with vertical NPN devices for complementary circuits. There are basically two main reasons why the lateral PNP transistor is a low gain device. First, the base width $W_b$ which is a critical perimeter in determining both current gain and cut-off frequency, is determined by the lithographic capability and is usually very large as compared with that of vertical NPN transistors. For example, $W_b$ for conventional lateral PNP transistors is larger than 1.0 micrometers. Second, there is a parasitic diode for parasitic PNP transistor between the base and emitter of lateral PNP transistors which greatly reduces the current gain for the transistors. The extent that the lateral PNP transistor's current gain is reduced by this parasitic transistor is increased with the size of the parasitic transistor which, in turn, is proportional to the bottom face area of the lateral PNP transistor's emitter region. Therefore, in order to increase current gain of a lateral PNP, both the base width and the emitter region of the transistor must be minimized.

It is the object of this invention to provide structures and fabrication methods to minimize the base width and the emitter region size of the lateral transistor.

It is a further object of this invention in one embodiment to almost totally eliminate the parasitic transistor in the lateral transistor by use of a buried silicon dioxide isolation below the emitter contact for the lateral transistor.

SUMMARY OF THE INVENTION

The lateral transistor is described which has both its base width and the emitter region of the transistor minimized. This minimization of the elements of the lateral transistor gives high performance. The lateral transistor which may be typically PNP transistor is formed in a monocrystalline semiconductor body having a buried N+ region within the body. A P+ type emitter region is located in the body. An N type base region is located around the side periphery of the emitter region. A P+ type collector region is located in the body surrounding the periphery of the base region. A first P+ polycrystalline silicon layer acting as an emitter contact for the emitter region is in physical and electrical contact with the emitter region and acts as its electrical contact. A second P+ polycrystalline silicon layer is located on the surface of the body to make physical and electrical contact with the collector region. A vertical insulator layer on the edge of the second polycrystalline silicon layer isolates the two polycrystalline silicon layers from one another. The N base region at its surface is located underneath the width of the vertical insulater layer. An N+ reach-through region extending from the surface of the body to the buried N+ region acts as an electrical contact through the N+ buried layer to the base region. The width of the vertical insulator has a width which is equal to the desired base width of the lateral PNP transistor plus lateral diffusions of the collector and emitter junctions of the lateral PNP. The preferred structure is to have the emitter formed around the periphery of a channel or groove which has at its base a insulating layer such as silicon dioxide. The parasitic transistor is almost totally eliminated by this buried oxide isolation.

A lateral PNP and vertical NPN transistor structure formed in a monocrystalline semiconductor body composed of a P type substrate, an N type epitaxial layer thereover, a buried pattern of N+ type regions located at the interface of the substrate and the epitaxial layer is described. A deep dielectric isolation region surrounding the designated PNP and NPN transistor regions and extending into the body so as to fully isolate one of the pattern of buried N+ regions from the others is formed. The PNP lateral transistor structure includes a P type emitter region, and N type base region surrounding the side periphery of the emitter region, and a P type collector region in the body surrounding the base region. A first P+ polycrystalline silicon layer is in physical and electrical contact to the emitter region, a second P+ polycrystalline silicon layer on the surface of the body in physical and electrical contract with the collector region and a vertical insulating layer on the edge of the second polycrystalline silicon layer to isolate the two polycrystalline silicon layer from one another. The lateral transistor's base region at its surface is located underneath the width of the vertical insulating layer. In the preferred structure the emitter region is around the periphery of a groove or a channel having an isolating dielectric layer such as silicon dioxide at its base. Adjacent to the PNP transistor is a vertical NPN transistor which includes N+ type emitter region, a P type base region surrounding the emitter, a third P+ polycrystalline layer in electrical contact with the base region, and a fourth N+ type polycrystalline silicon layer in electrical contact with the emitter region. An N+ reach-through region extends from the surface of the body to the buried N+ region. The reach-through region through the buried N+ region is the base contact of the lateral PNP and the collector contact of the vertical transistor. Surface dielectric isolation regions are provided for isolating the NPN base-emitter region from the N+ region reach-through region and the PNP region area from one another.

The high performance lateral transistor described above may be fabricated by first providing a monocrystalline semiconductor body having a principal surface and where the desired transistor is a PNP transistor, a buried N+ region. The collector region of the transistor is formed into the surface by diffusing P type impurities into the desired region. A first P+ polycrystalline silicon layer is formed over the surface so that portions of the layer are in direct contact with the collector region. An insulating layer is formed upon the top surface of the first polycrystalline layer. The first polycrystalline silicon layer and insulator layer is patterned with substantially vertical edges wherein the layer is removed from over areas designated to be the emitter and base regions of the transistor. N type impurities are diffused into the designated emitter and base regions. A vertical insulator is formed on the vertical edges of the polycrystalline silicon layer. The structure is heated to fully form the collector region by outdiffusion from the first polycrystalline silicon layer. A second P+ polycrystalline silicon layer is formed over the areas designated to be the emitter region of the transistor. The structure is heated to form the P+ emitter region by outdiffusion from the second polycrystalline silicon layer and to thereby define the base region located underneath the vertical insulator. Contacts are made to the transistor wherein the first polycrystalline silicon layer is the collector contact, the second polycrystalline silicon layer is the emitter contact and an N+ reach-through from the surface makes contact through the buried N+ region to the base region. As in the lateral PNP device described above it is preferred to have the emitter located in a groove or channel. The method for accomplishing this involves an etching of the substantially vertical walled groove in a monocrystalline semiconductor body using the patterned first polycrystalline silicon layer with top insulator and vertical insulator as the etching mask. Oxygen is then ion implanted into the bottom of the groove to form a silicon dioxide region at the bottom of the groove. The second P+ polycrystalline silicon layer is then formed on the surface which will in turn fill the groove with this material. The heating of the structure forms the P+ emitter region around the side edges of the P+ polycrystalline silicon filled groove.

The method for fabricating the vertical NPN and lateral PNP transistors in the same semiconductor body involves providing a P monocrystalline semiconductor substrate, a pattern of N+ regions in the substrate and growing an N epitaxial layer on the surface of the substrate having the N+ regions. The N+ will grow into the epitaxial layer from the substrate during the growth of the epitaxial layer to form the buried N+ regions. Isolated regions of monocrystalline semiconductor are formed in the substrate having the epitaxial layer thereon wherein at least one of the pattern of said N+ regions is located within the regions designated to have NPN and PNP devices formed therein. The designated lateral PNP surface areas are dielectrically isolated from the designated base-emitter region of the NPN surface areas and the designated common N+ reach-through connected to the N+ buried layer. The devices are then formed within the same monocrystalline semiconductor isolated region. Contacts are made to the PNP and NPN transistors wherein one portion of the first P+ polycrystalline silicon layer is the PNP collector contact, a second portion of the first polycrystalline silicon layer is the NPN extrinsic base contact, the second polycrystalline silicon layer is the PNP emitter contact, the N+ reach-through from the surface makes a common contact through the N+ buried layer to the base region of the PNP and the collector region of the NPN, and that N+ polycrystalline silicon layer is the NPN emitter contact.

BRIEF DESCRIPTION OF THE DRAWINGS

The drawings show the following:

FIGS. 11 and 12 illustrate two of the possible horizontal layouts for the lateral PNP transistor for either of the two embodiments.

DISCLOSURE OF THE INVENTION

Figure 1:
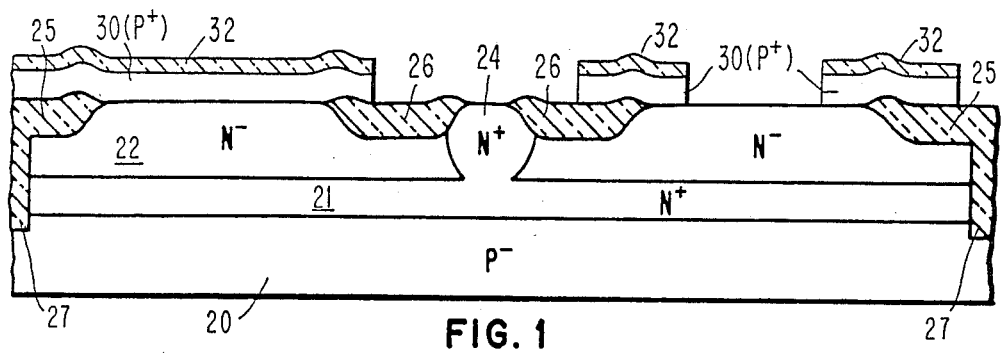
FIGS. 1 through 5 illustrate a first embodiment for fabricating the high performance a complementary bipolar transistor structure.

Referring now more particularly to FIGS. 1 through 5, the manufacturing steps for the complementary bipolar transistors utilizing the present method is described. FIG. 1 illustrates one small, greatly enlarged portion of a silicon body which will be used to form a very dense bipolar integrated circuit. A P− substrate of monocrystalline silicon 20 has a blanket subcollector N+ diffusion 21 made therein. An epitaxial N layer 22 is then grown on top of the substrate. These processes are standard processes in the formation of, for example, NPN bipolar transistors. The substrate is typically a <100> crystallographic orientation silicon wafer having a resistance of the order of 1 to 20 ohm-cm. The subcollector diffusion is typically formed using arsenic having a surface concentration of about $10^{20}$ atoms/cm$^3$. The epitaxial growth process to form layer 22 may be by conventional techniques, such as the use of SiCl$_4$/H$_2$ or SiH$_4$ mixtures at temperatures about 1000° C. to 1200° C. During the epitaxial growth the dopant in the N+ layer moves into the epitaxial layer. The thickness of the epitaxial layer for highly dense integrated circuits is of the order to 3 micrometers or less.

The next series of steps involves the formation of isolation means for isolating regions of monocrystalline silicon from other regions of monocrystalline silicon. The isolation may be by back biasing PN junctions, partial dielectric isolation or complete dielectric isolation. The dielectric materials used may be silicon dioxide, glass, etc. The preferred isolation for highly dense integrated circuits is dielectric isolation. The FIG. 1 shows partial dielectric isolation with dielectric regions 25 isolating monocrystalline silicon regions of the silicon body from one another and a region 26 which isolates the base emitter region from the collector reach-through region. There are many ways in the art to form dielectric regions of this type. One such process is described in the J. A. Bondur, et al. U.S. Pat. No. 4,104,086, issued Aug. 1, 1978 and assigned to the assignee of the present patent application. In that patent application the process for forming partial dielectric isolation for regions 25 and 26 is described in detail. Also, it is preferred to have extended isolation regions 27 extending through the epitaxial layer 22 and subcollector layer 21 into the substrate 20. These regions 27 may be formed by reactive ion etching through the various layers and into the substrate. Then, the openings may be filled by thermal oxidation and/or combination with chemical vapor deposition of any one or combination of materials such as silicon dioxide, silicon nitride, polycrystalline silicon, etc. The major surface having this isolation cleaned of all masking layers. The N+ reach-through region 24 may be formed at this time by using a silicon dioxide or photoresist mask. Alternatively, region 24 can be formed at a later point in the process.

There is now deposited a first polycrystalline silicon layer 30 over the entire surface having the surface isolation pattern 25, 26. The first polycrystalline silicon layer 30 may be deposited by any of a variety of techniques one of which is by way of example using silane in a temperature range of about 500° to 1000° C. and preferably about 600° C. The operative thickness of the polycrystalline silicon layer is between about 50 to 300 nanometers with about 50 to 1000 nanometers preferred. The polycrystalline silicon layer in this embodiment is in direct contact with the monocrystalline silicon body. The polycrystalline silicon layer 30 may be doped as deposited or may be deposited substantially undoped and then doped by a subsequent ion implantation and heating process. The ion implantation dosage in the implantation of the undoped polycrystalline silicon alternative is between about $1 \times 10^{14}$ to $1 \times 10^{15}$ ions/cm$^2$ at 50 to 80 KeV.

An insulator layer 32 is now deposited over the first polycrystalline silicon layer 30. Where the layer 32 is composed of silicon dioxide, it may be chemically vapor deposited in, for example, using SiH$_4$Cl$_2$ and N$_2$O at a temperature of about 800° C. or less under atmospheric or low pressure conditions. Alternatively, the layer can be thermally grown in an oxygen or oxygen-water vapor ambient at a temperature of about 970° C. In this alternative, the first polycrystalline silicon layer 30 would be required to be thicker, for example, 100 nm additional polycrystalline silicon for 200 nm of thermal silicon dioxide. The operative thickness of the silicon dioxide layer is between about 50 to 500 nanometers and a preferred thickness of 150 to 300 nanometers. Alternatively, the layer 32 may be composed of silicon nitride or a combination of layer of silicon dioxide and silicon nitride. A deposition of the silicon nitride layer is usually formed by chemical vapor deposition using the process conditions of silane, ammonia and nitrogen carrier gas at a temperature of about 800° C. or higher using atmospheric or low pressure conditions as discussed in the V. Y. Doo U.S. Pat. No. 4,089,992. The operative thickness of the silicon nitride layer is between about 10 to 200 nanometers and 50 nanometers is preferred. The layered structure 30, 32 is patterned by conventional lithographic and etching techniques. However, it is important that the edges of the patterned structure 30, 32 are substantially vertical. Therefore, anisotropic reactive ion etching is the preferred etching process. The resulting structure is shown in FIG. 1.

The etching step utilized for the layered structure 32, and 30 is preferably an anisotropic etching process utilizing carbon tetrafluoride or chlorinated hydrocarbon gases such as described in J. S. Lechaton and J. L. Mauer "A Model for Etching of Silicon in Cl$_2$/Ar Plasma" in Plasma-Proceedings Symposium on Plasma Etching and Deposition, R. G. Frieser et al., the Electrochemical Society 1981, pp. 75-85. It may be preferable to use different etchants for each of the layers such as carbon tetrafluoride, CF$_4$, for silicon nitride, CF$_4$—H$_2$ for silicon dioxide and CF$_4$ for polycrystalline silicon.

The openings in these layers 30, 32 are located where it is desired to have the base-emitter areas of the lateral PNP transistor and the collector reach-through portion of the bipolar devices under fabrication.

Figure 2:
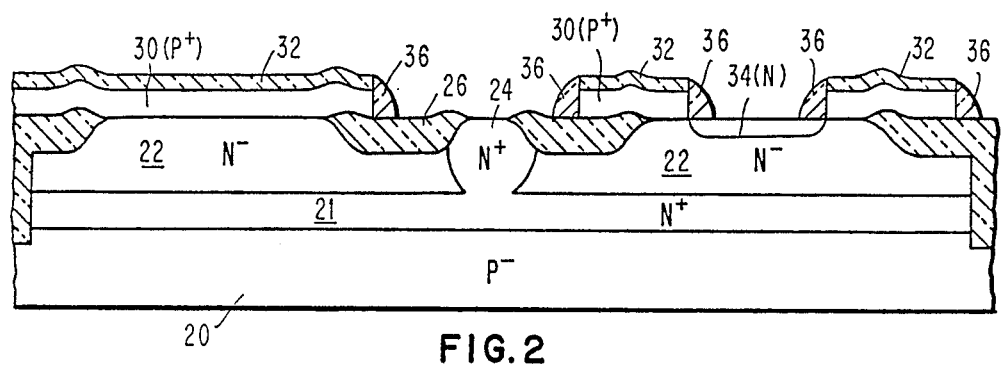

The base region doping level is set by diffusion or implantation of arsenic or phosphorus ions to form N regions 34 in the N— epitaxial region 22 as seen in FIG. 2. The surface concentration of region 34 is of the order of $10^{20}$ atoms/cm$^3$.

A sidewall insulator layer 36 is formed upon vertical sidewalls of the layered structure 32 and 30. This layer 36 is preferably silicon dioxide. However, the layer may alternatively be composed of silicon nitride, or the like or combinations of these insulators with silicon dioxide. A silicon dioxide layer may be formed by a vapor deposition process wherein silane, oxygen at 450° C. is used or SiH$_2$Cl$_2$ and N$_2$O at a temperature of about 800° C. under atmospheric or low pressure conditions are utilized. This layer is uniformly deposited to a precise thickness over the layers 32, 30 on both the horizontal and vertical surfaces thereof. The thickness of the sidewalls 36 are that of the desired base width and the lateral diffusions of the lateral PNP emitter and collector junctions. This layer 36 is then subjected to preferential removal from the horizontal surfaces while substantially leaving the layer upon the substantially vertical sidewalls in an anisotropic etching ambient. The etching may be done, for example, in a reactive ion etching system using CF$_4$ and H$_2$ gases as described in L. M. Ephrath, J. Electrochem. Society, Vol. 124, P. 284C(1971). The result of the sidewall formation is shown in FIGS. 2. A thickness of the sidewall 36 is preferably between about 100 to 500 nanometers.

Figure 3:
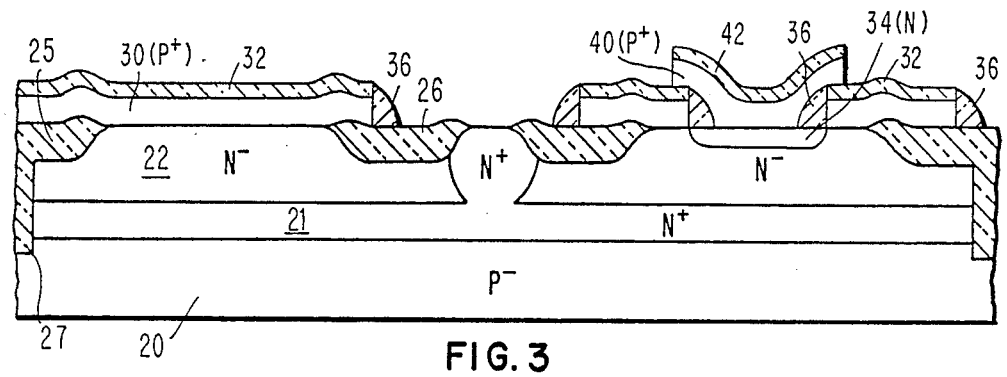

Referring now to FIG. 3, there is now deposited a second polycrystalline silicon layer 40 over the entire surface of the FIG. 2 structure. The second polycrystalline layer 40 may be deposited as described above for the first polycrystalline silicon layer and have conductivity inducing impurities implanted therein in the same way as described in regard to the first polycrystalline silicon layer. The second polycrystalline silicon layer is doped with P+ impurities. An insulating layer 42 is deposited over the second polycrystalline silicon layer in a similar manner as described above in regard to the insulating layer 32. The layered structure 40, 42 is patterned by conventional lithography and etching techniques. It is also important to have the edges of the patterned structure 40, 42 substantially vertical through the use of anisotropic reactive ion etching as described above in regard to the first polycrystalline silicon layer. The lithographic and etching techniques result in leaving the second polycrystalline silicon layer and insulator 40, 42 only above the emitter designated area for the lateral PNP transistor. The second polycrystalline silicon layer is formed directly upon the monocrystalline silicon surface at this point of the structure as shown in the FIG. 3 structure.

Figure 4:
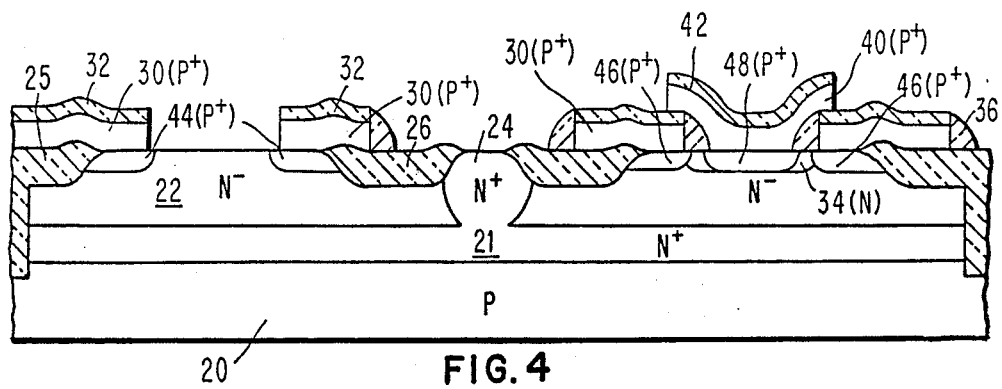

The intrinsic base window of the vertical NPN transistor is now opened by conventional lithographic and etching techniques. The etching technique is again required to produce substantially vertical sidewalls on the layers 30, 32 as shown in FIG. 4. This vertical sidewall may be obtained by use of the anisotropic reactive ion etching techniques described above. A preliminary dopant drive-in is carried out at a temperature of about 800° to 1000° C. for a time of about 10 to 20 minutes to form: the extrinsic base region 44 of the vertical NPN transistor, the collector region 46 of the lateral PNP transistor, and the emitter 48 of the lateral PNP transistor. In addition, the base diffusion region 48 of the lateral PNP transistor is also driven to a depth approximately equal to that of the collector-emitter P+ junction as shown in FIG. 4. A base ion implantation of $1 \times 10^{13}$ to $1 \times 10^{16}$ boron atoms/cm$^2$ at 50–100 KeV is used to form P type base region 51. The surface concentration of this layer is of the order of $1 \times 10^{18}$ to $1 \times 10^{19}$ boron atoms/cc.

Figure 5:
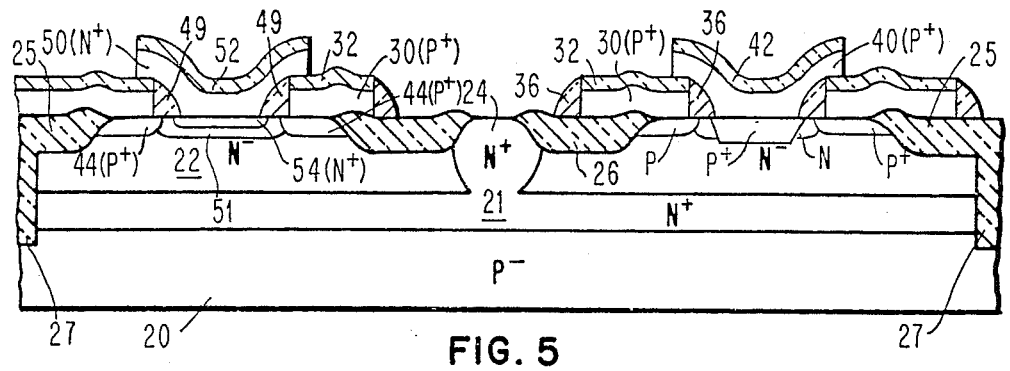

Referring now more particularly to FIG. 5, a sidewall structure 49 composed of an insulating material is formed upon the vertical sidewalls of the layered structure 30, 32. This layer is preferably silicon dioxide, but may be alternatively composed of silicon nitride or the like or combinations of these insulators with silicon dioxide. The layer is uniformly deposited to a precise thickness over the vertical and horizontal surfaces of the layers 30, 32. The layer 49 is then subjected to preferential removal from the horizontal surfaces while substantially leaving the layer upon the substantially vertical sidewalls in anisotropic etching ambient to produce the sidewall structure 49.

A uniform thickness layer of N+ polycrystalline silicon is deposited over the entire surface and doped as described above in regard to the first and second polycrystalline silicon layers except with an N dopant such as arsenic or phosphorus rather than boron. After the N+ polycrystalline silicon layer 50 has been completed a insulating layer 52 of any one of the variety of the insulating materials as suggested above is formed thereover. The layers 50, 52 are patterned by conventional lithographic and etching techniques to form the FIG. 5 structure wherein these layers are only located above the designated emitter region 54 of the vertical NPN device. The structure is heated at 800° to 1000° C. for 10 to 60 minutes to form the N+ emitter region 54 by outdiffusion from layer 50.

Openings (not shown) may now be made through the various insulator layers to make contact to the elements of the PNP-NPN structure. Suitable next level metallurgy such as aluminum, aluminum-copper and the like may be deposited and lithographically patterned for the desired next level electrical connections.

An emitter size of about $3 \times 3$ $\mu$m$^2$ or smaller of the lateral PNP transistor can be made using conventional or electron beam lithographic manufacturing techniques and equipment. While a complementary bipolar transistor structure is described in the FIG. 1 through 5 embodiment, it is obvious that a lateral bipolar transistor alone can be manufactured by this process.

A second embodiment for manufacturing a lateral bipolar transistor or a combination of a lateral bipolar transistor and a vertical transistor of the opposite conductivity types within the same dielectrically isolated pocket is illustrated in FIGS. 6 through 11. These Figs. illustrate the manufacture of an NPN vertical transistor and PNP lateral transistor but it is obvious that a integrated circuit structure could be formed of solely lateral bipolar transistors. The process enables the fabrication of a lateral transistor such as a PNP with zero parasitic transistor effect.

Figure 6:
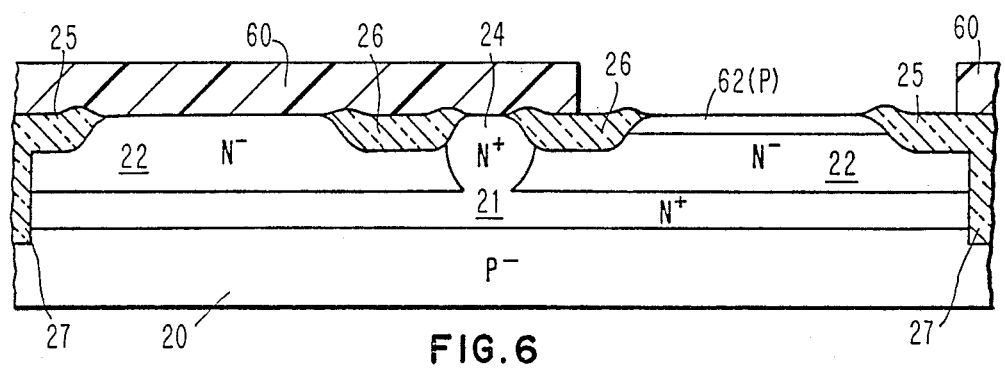
FIGS. 6 through 11 show a modification of the FIGS. 1 through 5 process which has even greater device performance advantages then the first embodiment.

The process for manufacturing the second embodiment is identical through the isolation structure. Like numbered structures indicate like structures between the two embodiments FIGS. 1 through 5 and 6 through 11. Referring now to FIG. 6, a resist mask 60 is utilized to cover the planned vertical NPN transistor area. The areas designated to have lateral PNP transistors are opened by means of standard lithographic and etching techniques. A boron diffusion or preferably ion implantation is made with a dosage level/energy suitable for the lateral PNP transistor collector region is implanted in the total device region as region 62. The block-out resist mask 60 is then removed by suitable etching techniques.

Figure 7:
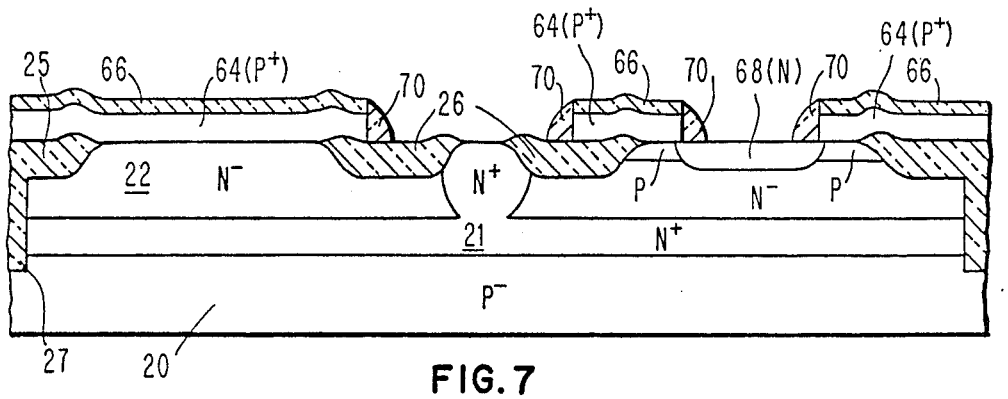

A first P+ polycrystalline silicon layer 64 is formed over the entire principal surface of the structure. An insulating film 66 is formed thereover. As in the first embodiment the layered structure 64, 66 is now patterned for the desired purpose in this embodiment of forming the desired collector plate of the lateral PNP transistor structure and to allow coverage of the entire active surface of the planned vertical NPN transistor structures. An N type diffusion or preferably an ion implantation using arsenic or phosphorus ions is used to form the base region 68 of the lateral PNP transistor. Now a suitable sidewall spacer 70 is formed having a width so designed such that the width is equal to the sum of the lateral PNP base width and the lateral diffusions of the lateral PNP collector and emitter junctions. This sidewall structure is formed as described in the first embodiment by uniform deposition of a layer 70 followed by anisotropic preferential etching of the horizontal portions of that film 70 to leave the vertical sidewalls structures 70. The result of this process is shown in FIG. 7.

Figure 8:
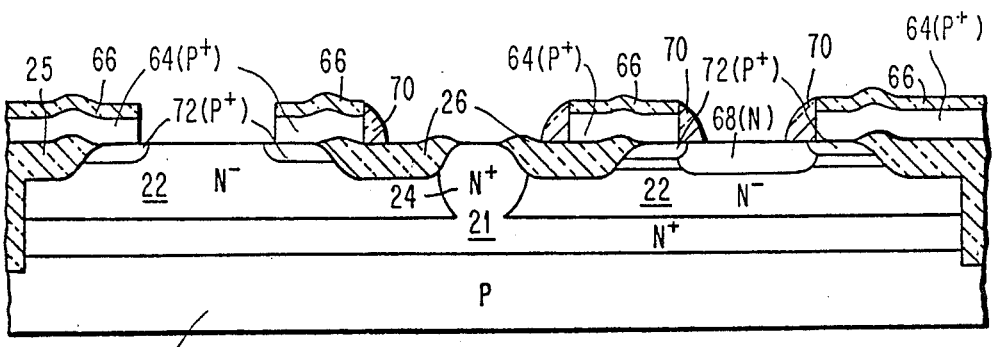

The extrinsic base window of the vertical NPN transistor is open by lithographic and etching techniques. At this time the extrinsic plate or contact of the vertical NPN transistor is formed in the first P+ polycrystalline silicon layer 64 as shown in FIG. 8. The structure is heated in an appropriate inert atmosphere of nitrogen or argon, at a appropriate temperature of between about 800° and 1050° C. for a period of time of between about 20 to 60 minutes. During this heating step the extrinsic base regions 70 of the vertical transistor, the collector regions 72 of the lateral PNP transistor are formed by outdiffusion from the first P+ polycrystalline layer 64. Then using a blockout resist mask (not shown), a P+ ion implantation is done to produce the base region 73 of the vertical NPN device. The surface concentration is between about $1 \times 10^{18}$ to $1 \times 10^{19}$ boron atoms/cc. The result of this process is shown in FIG. 8.

Figure 9:
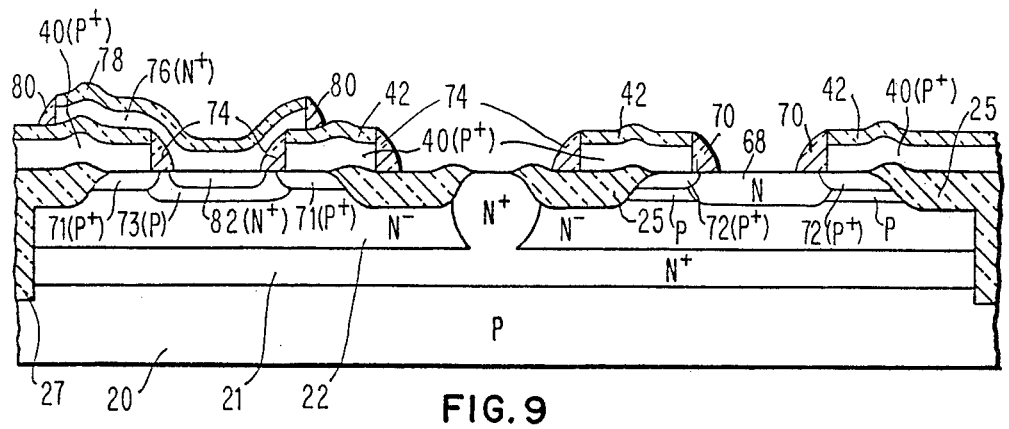

Referring now to FIG. 9, sidewall structures 74 are formed on the sidewalls of the first P+ polycrystalline silicon layer 64 and insulated layer 66 in the vertical NPN transistor areas. The sidewalls are formed as was described in regard to sidewalls 70. An N+ polycrystalline silicon layer 76 is formed on the surfaces of the structure as was the similar N+ polycrystalline silicon layer 40 in the first embodiment. A insulating layer 78 is formed thereover. The layers 76, 78 are patterned by lithographic and etching techniques to leave these layers 76, 78 only in the designated vertical emitter area as shown in FIG. 9. Sidewalls 80 are formed on the sides of the pattern 76, 78 as shown in FIG. 9. During this sidewall process the other sidewall structures 70 will increase in size somewhat. The structure is then thermally annealed at a temperature of 1000° C. for a time of between about 20 to 40 minutes to form the N+ emitter region 82 by outdiffusion from the N+ polycrystalline silicon layer 76. The result of this series of steps is illustrated in FIG. 9.

The exposed N region 68 of the lateral PNP transistor is now anisotropically reactive ion etched by placing the FIG. 9 structure in a suitable silicon etching ambient. Conventional gases or gas mixtures for reactive ion etching of silicon, e.g. $SF_6$, $CF_4$, $CCl_2F_2$ plus oxygen, etc., may be used. The depth of the emitter trench etched can be monitored by timing or by conventional laser interference detection techniques. The depth of the reactive ion etched trench is between about 0.5 to 2.0 micrometers. The deepest depth dimension is about the same as the depth of the P region 62 in order to maximize the vertical emitter surface area of the lateral PNP transistor. The N+ reach-through region 24 is protected during this reactive ion etching by a layer of resist (not shown). The remaining surfaces of the structure are protected by insulating layers not adversely affected by the reactive ion etching process.

Figure 10:
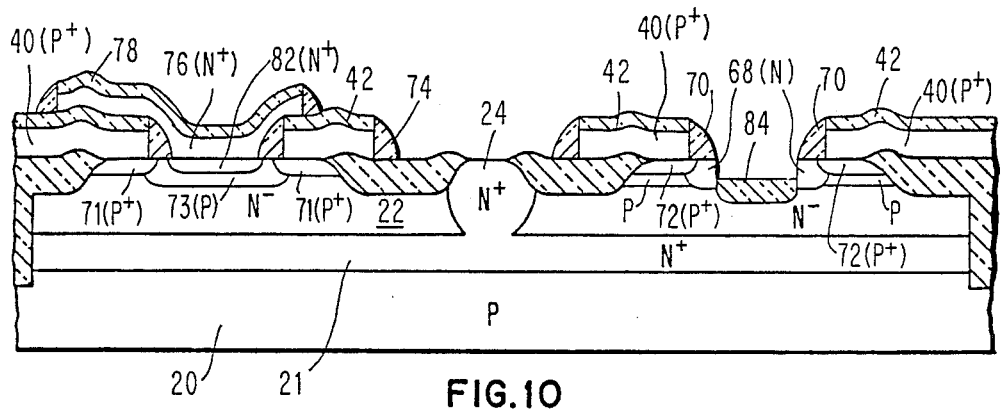

A buried silicon dioxide isolation region 84 is now formed by an oxygen ion implantation method on the bottom of the emitter trench. The method involves implanting of oxygen at dose in the range of between about $1 \times 10^{13}$ to $1 \times 10^{16}$ atoms/cm$^2$ and at a power in the range of between about 50 to 200 KeV. The wafers are thermally annealed at 600° to 1000° C. for a period of 20 to 40 minutes. More details of this oxygen ion implantation process may be found in the IBM TDB Vol. 22, Pages 4523-4525. The resulting structure is shown in FIG. 10 after the resist layer which protects the N+ reach through 24 is removed.

Figure 11:
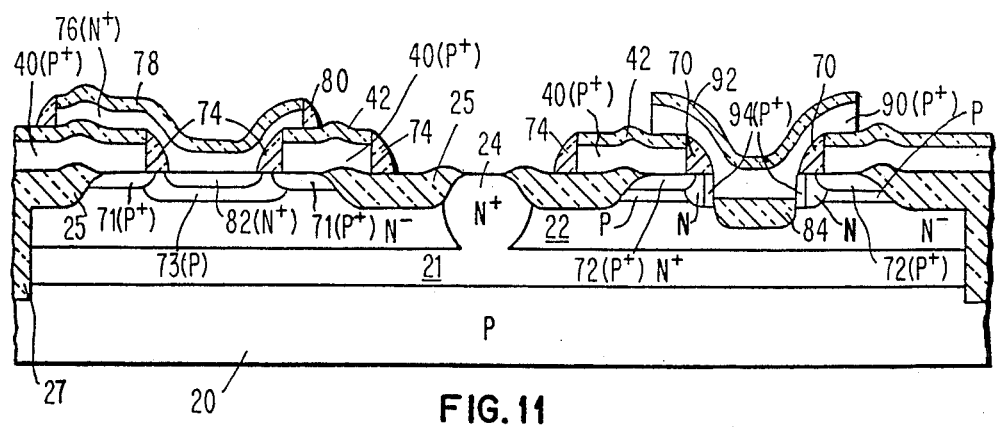

A second P+ polycrystalline silicon layer 90 and insulator layer 92 are deposited over the major surface of the structure. These layers are formed according to a similar techniques to that of the second P+ polycrystalline silicon layer and insulator formed in the first embodiment structure. Lithographic and etching techniques are utilized to pattern the layers 90, 92 to restrict these layers to the area of the lateral PNP and the desired emitter plate area. The structure of FIG. 11 is heated at a temperature of about 900° to 1000° C. for a time of 20 to 40 minutes to form the vertical P+ emitter regions 94 surrounding the trench in the lateral PNP transistor area. This structure is illustrated in FIG. 11. The emitter base junction depth is about 50 to 300 nanometers. The base width is of the order of about 50 to 300 nanometers. The structure has zero parasitic transistor effects due to the presence of the insulating layer 84.

Suitable next level metallurgy such as aluminum, aluminum-copper, tantalum and the like is blanket deposited and lithographically patterned for the desired next level electrical connections. The vertical NPN emitter contact is 100 and base contact is 102. The lateral PNP emitter contact is 104 and collector contact is 106. The common vertical NPN collector contact and lateral PNP base contact is 108.

Figure 12:
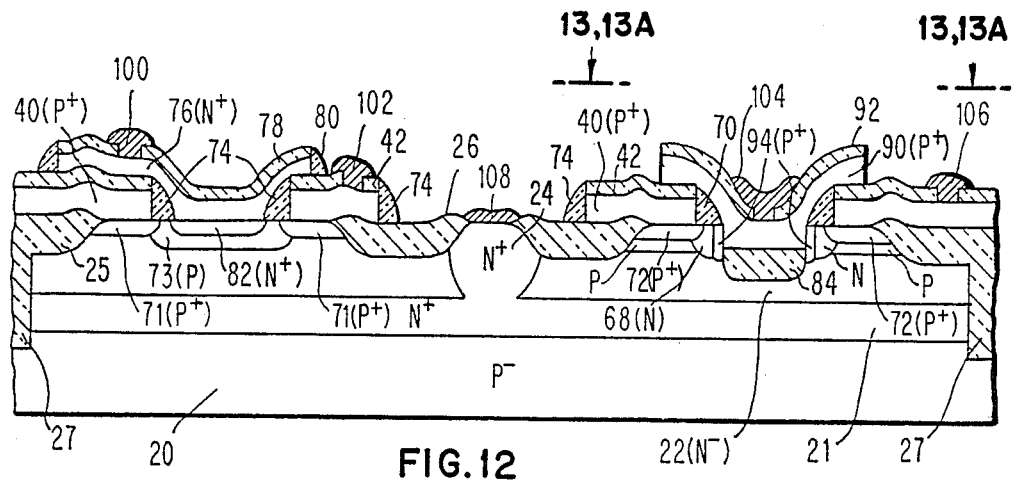
Figure 13:
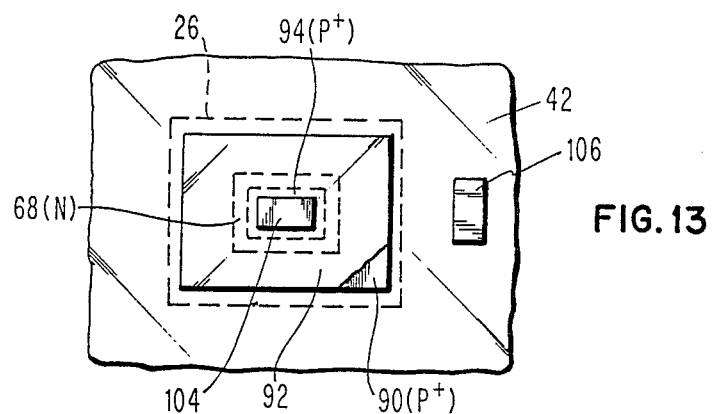
Figure 13A:
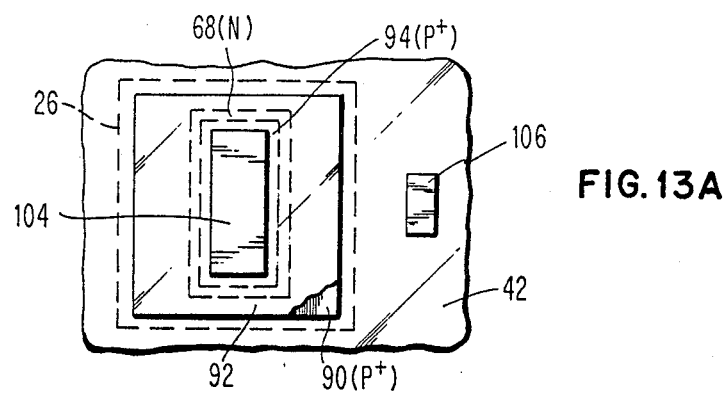

The layouts alternate top views of the PNP lateral device of FIG. 12 are shown in FIGS. 13 and 13A. They are for two different applications of lateral PNP devices. When the gain of the device is more important, the top view layout in FIG. 13 is used and when the switching property is more important the top view layout shown in FIG. 13A is used. Although, the layout shapes are different in FIGS. 13 and 13A the elements are identically numbered.

A common base-collector structure as above described can be used for desirable circuit applications. For example, the PNP device can be used as an active load in a memory cell. This application can be better understood with reference to 1983 IEEE International Solid-State Circuits Conference, "SESSION IX: FAST RAMs" pg. 108 through 109. Further, I²L (Integrated Injection Logic) or MTL (Merged Transistor Logic) has a common NPN collector and PNP base contact.

While the invention has been particularly shown and described with reference to prefered embodiments thereof it will be understood by those skilled in the art that various changes in form and detail may be made therein without departing from the spirit and scope of the invention. For example, the lateral PNP transistors described in the embodiment and illustrated in the drawings as part of a complementary bipolar structure with a vertical NPN transistor may obviously be utilized separately without any vertical transistors. Further, vertical PNP bipolar transistors can be formed rather than vertical NPN transistors illustrated by simply using the opposite conductivity types for each of the regions described. Also, the lateral PNP transistor can have the reversal of conductivity types for each of these regions to form lateral NPN transistors. Still further, metal silicide contacts can be formed on the surfaces of the polycrystalline silicon layers for higher level contacts to these elements.

What is claimed is:

1. A lateral PNP transistor comprising:
   a monocrystalline semiconductor body having an N type principal surface;
   a buried N+ region within said body;
   a P type emitter region in said principal surface of said body;
   an N type base region in said body around the side periphery of said emitter region;
   a P type collector region in said body surrounding said base region;
   a first P+ polycrystalline silicon layer in physical and electrical ohmic contact with said collector region acting as collector contact for said collector region;

a first insulator layer on the top surface of said first P+ polycrystalline layer;

a second P+ polycrystalline silicon layer on the surface of said body in physical and electrical ohmic contact with said emitter region;

a second insulator layer on the top surface of said second polycrystalline layer;

a vertical insulator layer on the edge of said first polycrystalline silicon layer;

said first insulator layer and said vertical insulator layer electrically separates said first and second polycrystalline layers;

said N base region at its surface is located underneath the width of said vertical insulator layer;

an N+ reach-through region extending from the surface of said body to said buried N+ region and dielectrically isolated at the surface from the said emitter and base regions at the surface; and an electrical contact to said N+ reach-through region through said N+ buried layer to said base region.

2. The lateral PNP transistor of claim 1 wherein said vertical insulator has a width which is equal to the desired base width of said lateral PNP plus the lateral diffusions of the collector and emitter junctions of said lateral PNP.

3. The lateral PNP transistor of claim 2 wherein said width of said vertical insulator is between about 100 to 500 nanometers.

4. The lateral PNP transistor of claim 1 and further comprising a vertical NPN transistor, a dielectric isolation surrounding both said vertical NPN and lateral PNP and the isolation extending to a depth which isolates said buried N+ region from other such regions, and wherein the said buried N+ region is connected as the collector of said vertical NPN.

5. A lateral PNP transistor comprising:
a monocrystalline semiconductor body having an N type principal surface and a groove therein with substantially vertical sides;
a buried N+ region within said body and below said groove;
a silicon dioxide layer at the bottom of said groove;
a P type emitter region in said body around the side periphery of said groove;
an N type base region in said body surrounding said emitter region on the other side of the emitter region from said groove;
a P type collector region in said body surrounding said base region;
a first P+ polycrystalline silicon layer on the surface of said body in physical and electrical contact with said collector region;
a first insulator layer on the top surface of said first polycrystalline layer;
a second P+ polycrystalline silicon layer filling said groove and acting as emitter contact for said emitter region;
a second insulator layer on the top surface of said second polycrystalline layer;
a vertical insulator layer on the edge of said first polycrystalline silicon layer;
said first insulator layer and said vertical layer electrically separates said first and second polycrystalline layers;

portions of said vertical insulator layer being in alignment with the vertical sides of said groove;
said N base region at its surface is located underneath, the width of said vertical insulator layer;
an N+ reach-through region extending from the surface of said body to said buried N+ region and dielectrically isolated at the surface from the said emitter and base regions at the surface; and
an electrical contact to said N+ reach-through region through said N+ buried layer to said base region.

6. The lateral PNP transistor of claim 5 wherein said vertical insulator has a width which is equal to the desired base width of said lateral PNP plus the lateral diffusions of the collector and emitter junctions of said lateral PNP.

7. The lateral PNP transistor of claim 6 wherein said width of said vertical insulator is between about 100 to 500 nanometers.

8. The lateral PNP transistor of claim 5 and further comprising a vertical NPN transistor, a dielectric isolation surrounding both said vertical NPN and lateral PNP and the isolation extending to a depth which isolates said buried N+ region from other such regions, and wherein the said buried N+ region is also connected as the collector of said vertical NPN.

9. A lateral PNP and vertical NPN transistor structure comprising:
a monocrystalline semiconductor body composed of a P type substrate, and N type epitaxial layer thereover, a buried pattern of N+ type regions located at the interface of said substrate and said epitaxial layer;
a deep dielectric isolation region surrounding the designated said PNP and NPN transistor regions and extending into the said body so as to fully isolated one of said pattern of buried N+ region from the others;
a P type emitter region is said body;
an N type base region in said body surrounding the side periphery said emitter region;
a P type collector region in said body surrounding said base region;
a first P+ polycrystalline silicon layer in physical and ohmic electrical contact to said collector region acting as collector contact for said collector region;
a first insulator layer on top of said first P+ polycrystalline layer;
a second P+ polycrystalline silicon layer on the surface of said body in physical and electrical contact with said emitter region;
a second insulator layer on the top surface of said second P+ polycrystalline layer;
a vertical insulator layer on the edge of said second polycrystalline silicon layer;
said first insulator layer and said vertical layer electrically separates said first and second polycrystalline layers.
said N base region at its surface is located underneath the width of said vertical insulator layer;
adjacent to said PNP transistor is a vertical NPN transistor which includes an N+ type emitter region, a P type base region surrounding said emitter, a third P+ polycrystalline layer in electrical contact with said base region, a N+ type polycrystalline silicon layer in electrical contact with said emitter region;

an N+ reach-through region extending from the surface of said body. To said buried N+ region wherein the N+ reach-through region is the base contact through the N+ buried region of said lateral PNP and the collector contact through the N+ buried region of the vertical NPN; and surface dielectric isolation regions for isolating the NPN base-emitter region, the N+ reach-through region and the PNP region from one another.

10. The lateral PNP transistor of claim 9 wherein said vertical insulator has a width which is equal to the desired base width of said lateral PNP plus the lateral diffusions of the collector and emitter junctions of said lateral PNP.

11. The lateral PNP transistor of claim 10 wherein said width of said vertical insulator is between about 100 to 500 nanometers.

12. A lateral PNP and vertical NPN transistor structure comprising:

a monocrystalline semiconductor body composed of a P type substrate an N type epitaxial layer thereover, a buried pattern of N+ type regions located at the interface of said substrate and said epitaxial layer;

a deep dielectric isolation region surrounding the designated said PNP and NPN transistor regions and extending into the said body so as to fully isolated one of said pattern of buried N+ regions from the others;

a groove having substantially vertical sides extending from the surface of said epitaxial layer into said PNP region;

a silicon dioxide layer at the bottom of said groove;

a P type emitter region in said body around the side periphery said groove;

an N type base region in said body surrounding said emitter region on the other side of the emitter region from said groove;

a P type collector region in said body surrounding said base region;

a first P+ polycrystalline silicon layer on the surface of said body in physical and electrical contact with said collector region;

a first insulator layer on the top surface of said first polycrystalline layer;

a second P+ polycrystalline silicon layer filling said groove and acting as emitter contact for said emitter region;

a second insulator layer on the top surface of said second polycrystalline layer;

a vertical insulator layer on the edge of said first polycrystalline silicon layer;

said first insulator layer and said vertical layer electrically separate said first and second polycrystalline layers;

portions of said vertical insulator layer being in alignment with the vertical sides of said groove;

said N base region at its surface is located underneath the width of said vertical insulator layer;

adjacent to said PNP transistor is a vertical NPN transistor which includes an N+ type emitter region, a P type base region surrounding said emitter, a third P+ polycrystalline layer in electrical contact with said base region, a N+ type polycrystalline silicon layer in electrical contact with said emitter region;

an N+ reach-through region extending from the surface of said body to said buried N+ region wherein the N+ reach-through region is the base contact through the N+ buried region of said lateral PNP and the collector contact through the N+ buried region of the vertical NPN; and surface dielectric isolation regions for isolating the NPN base-emitter region the N+ region-through region and the PNP region from one another.

13. The lateral PNP transistor of claim 12 wherein said vertical insulator has a width which is equal to the desired base width of said lateral PNP plus the lateral diffusions of the collector and emitter junctions of said lateral PNP.

14. The lateral PNP transistor of claim 13 wherein said width of said vertical insulator is between about 100 to 500 nanometers.

* * * * *